United States Patent [19]

Thoms et al.

[11] Patent Number: 5,754,279
[45] Date of Patent: May 19, 1998

[54] METHOD AND APPARATUS FOR CHANGING PHOTOPRINTING GLASS IN PRODUCTION LINE

[75] Inventors: Roland Thoms, Freiburg; Peter Palmie, Mullheim, both of Germany

[73] Assignee: Demminer Maschinen Technik GmbH, Germany

[21] Appl. No.: 703,196

[22] Filed: Aug. 26, 1996

[51] Int. Cl.[6] .................................................. G03B 27/04
[52] U.S. Cl. ................................................................ 355/122
[58] Field of Search .................................. 355/122–132, 355/72

[56] References Cited

U.S. PATENT DOCUMENTS

| | | | |
|---|---|---|---|
| 1,338,894 | 7/1920 | Younkin | 355/122 |
| 2,720,146 | 7/1955 | Mears | 355/122 |
| 2,814,975 | 8/1957 | Mears | 355/122 |
| 3,199,430 | 8/1965 | Brown | 355/122 |
| 5,014,087 | 5/1991 | Byers | 355/72 |

*Primary Examiner*—R. L. Moses
*Assistant Examiner*—Shival Virmani
*Attorney, Agent, or Firm*—Jacobson & Johnson

[57] ABSTRACT

Apparatus for temporarily hinging the lower portion of oppositely disposed photoprinting plates to enable decoupling the hinged top portions of the photoprinting frames so that the photoprinting frames can be pivoted toward a horizontal position to easily facilitate replacement of the photoprinting glass plates in the photoprinting frames.

10 Claims, 4 Drawing Sheets

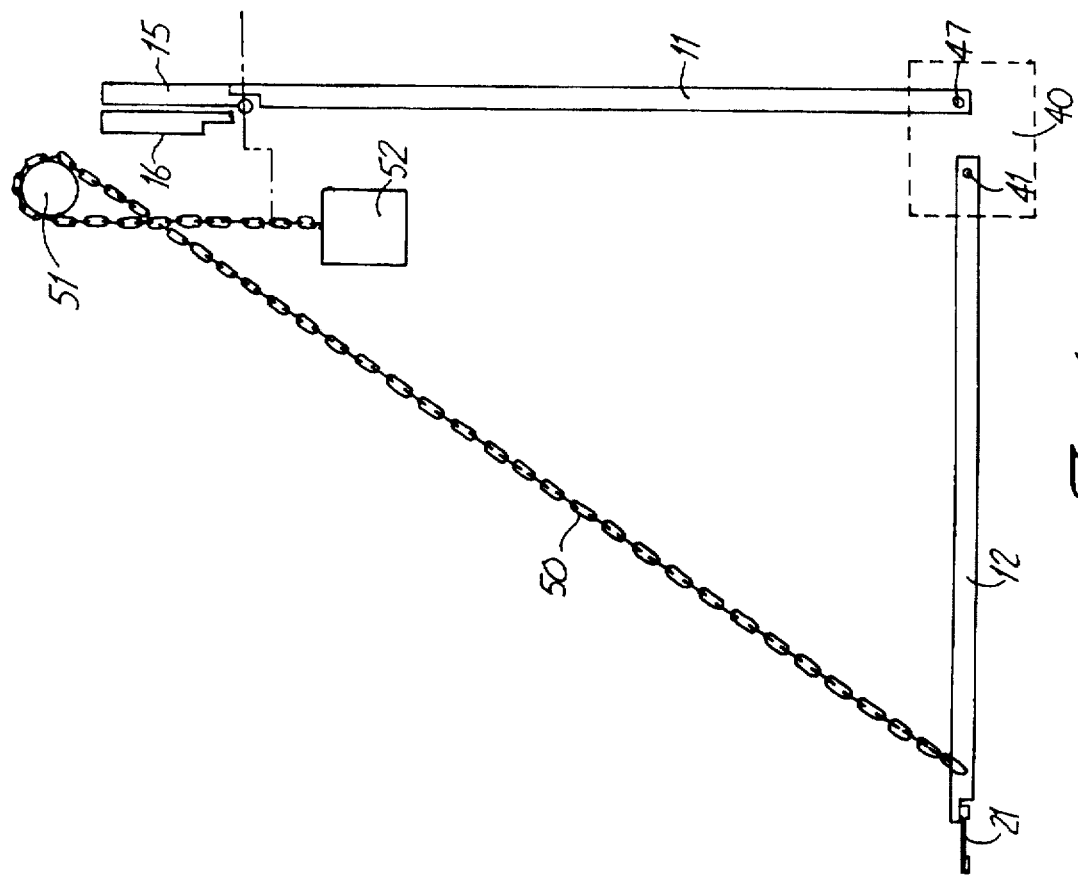
Fig. 6
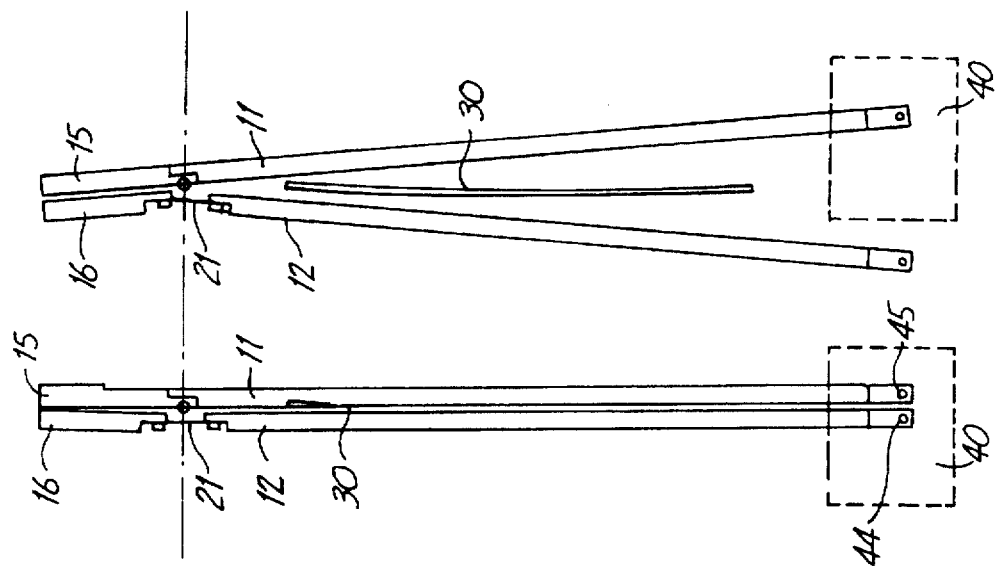
Fig. 5
Fig. 4

METHOD AND APPARATUS FOR CHANGING PHOTOPRINTING GLASS IN PRODUCTION LINE

FIELD OF THE INVENTION

The invention relates generally to photoprinting frames and, more specifically, to changing printing plates used in the assembly line production of etched products.

BACKGROUND OF THE INVENTION

Glass photoprinting plates which are supported by top hinged photoprinting frames, are used in the mass production of etched items such as shadow masks. The photoprinting frames are maintained in a vertical orientation while a resist covered web extends between opposed photoprinting frames. A top hinge allows the bottom portions of the opposed photoprinting frames to swing away from each other to permit the resist covered web to be periodically moved between the photoprinting frames, and to permit replacement of photoprinting glass plates. Adjusting plates on the top of the frames allows the photoprinting plates to be brought into proper registration with one another. During operation, the photoprinting plates are brought into contact with the resist covered web by drawing a vacuum between the two opposed photoprinting plates. Next, an image is exposed on the resist covered web by projecting light through the glass photoprinting plates carried by the photoprinting frames. Unfortunately, from time to time a glass photoprinting plate breaks and must be replaced. In addition, if different types of masks are etched, one has to change the glass photoprinting plate. As the glass photoprinting plates can be large and awkward to handle (i.e. lengths and widths on the order of 2 or 3 feet), the process of changing the photoprinting glass plates can be difficult. The present invention provides a system that facilitates the easy changing of photoprinting plates by temporarily hinging the lower portions of the photoprinting frames to allow decoupling of the top portion of the photoprinting frames, to further permit the photoprinting frames to be swung toward a horizontal position where the photoprinting glass plates can be more easily replaced in the photoprinting frames.

BRIEF DESCRIPTION OF THE PRIOR ART

U.S. Pat. No. 2,720,146 shows a photoprinting apparatus for printing on to light sensitive coatings located on a metal web.

U.S. Pat. No. 2,814,975 shows a further embodiment of a photoprinting apparatus for bringing two plates into registration with the use of of a micrometer screw means.

U.S. Pat. No. 3,199,430 shows a photoprinting apparatus to bring the plates into proper registration with the use of ball and socket joints.

SUMMARY OF THE INVENTION

Briefly, the invention comprises an apparatus and method for temporarily hinging the lower portion of oppositely disposed photoprinting frames to enable decoupling the normally hinged top portions of the photoprinting frames. With the top portion of the photoprinting frames decoupled, the photoprinting frames can be pivoted about the lower pivotal supports toward a horizontal position which facilitates the replacement of the photoprinting glass plates in the photoprinting plates.

BRIEF DESCRIPTION OF THE DRAWINGS

FIG. 4 shows oppositely disposed photoprinting frames in the closed position around a resist covered web;

FIG. 5 shows the oppositely disposed photoprinting frames of FIG. 4 in the open position to allow the resist covered web to be moved therebetween;

FIG. 6 shows the photoprinting frame decoupled from the adjustment plate and pivotally supported on the lower end to permit swinging the photoprinting frame toward the horizontal position.

DESCRIPTION OF THE PREFERRED EMBODIMENT

Figure 1:
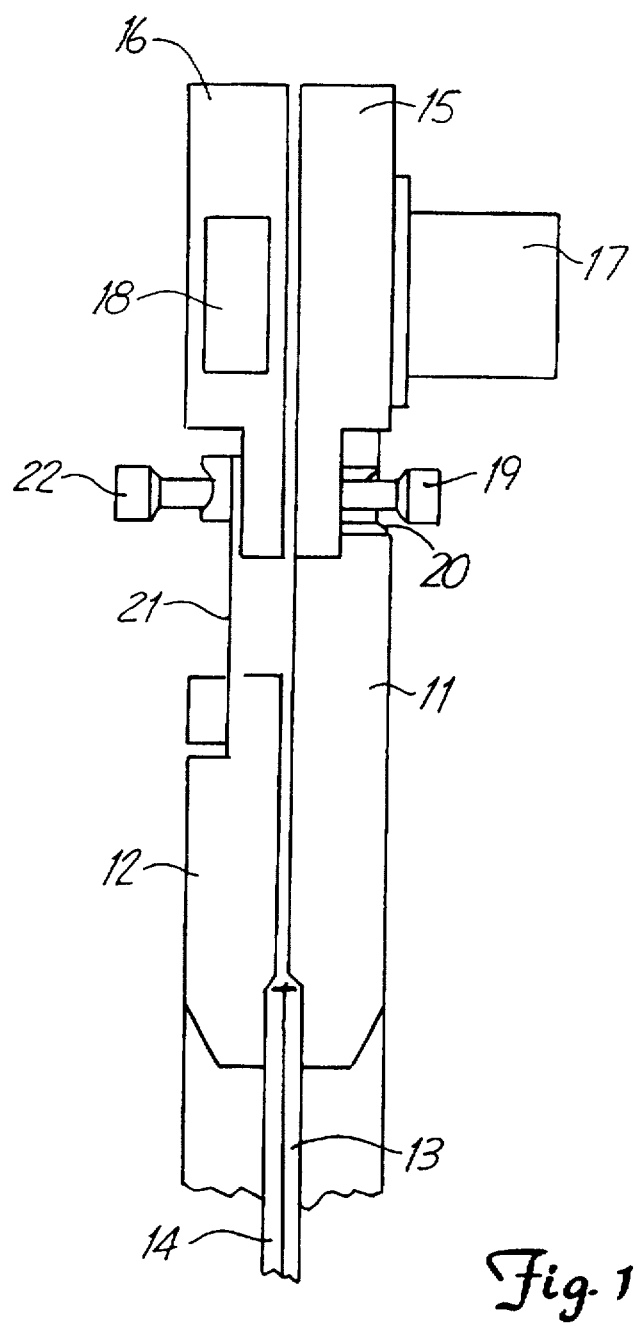
FIG. 1 shows a partial sectional side view of the top portion of opposed photoprinting frames and photoprinting glass plates therein held in a top pivotal arrangement.
Figure 2:
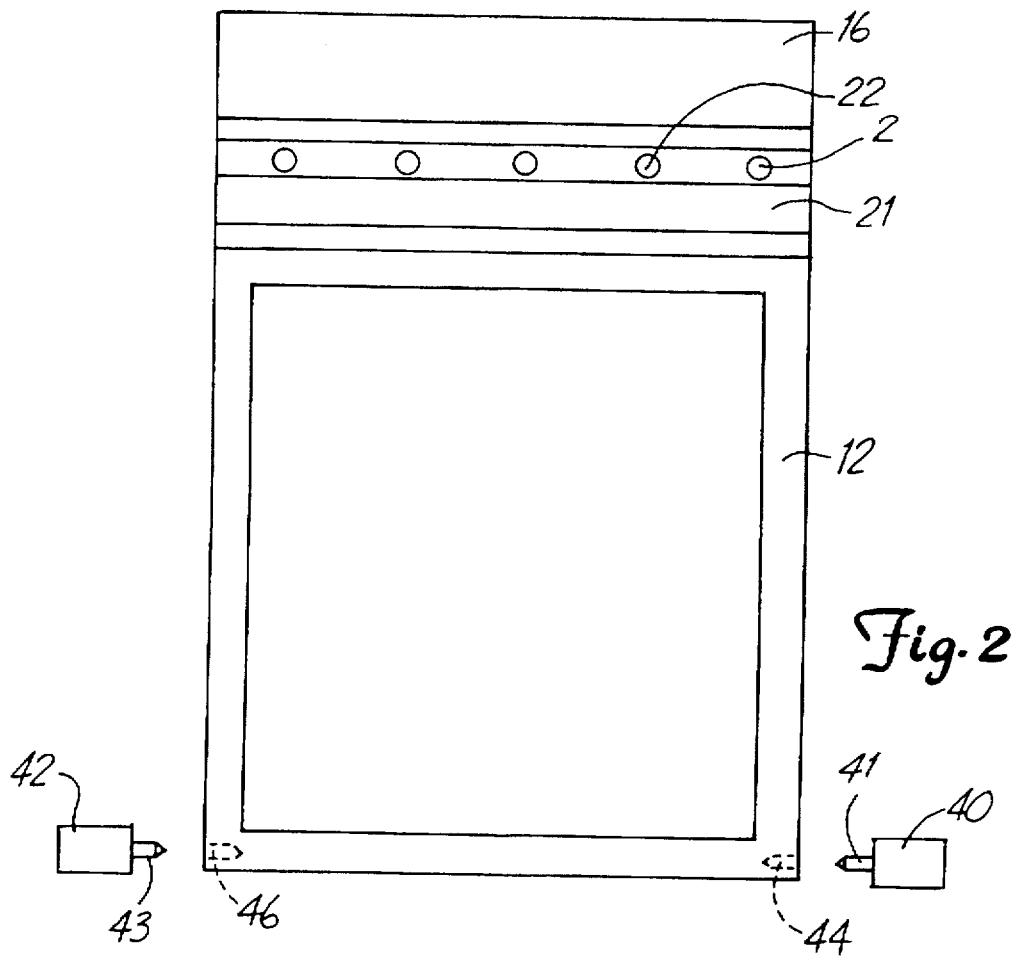
FIG. 2 shows a front view of a photoprinting frame with a temporary hinging mechanism located proximate the lower portion of the photoprinting frame.

FIG. 1 shows a set of photoprinting frames and support therefor. The system includes a photoprinting frame 12 having a photoprinting glass plate 14 therein which is oppositely disposed to a photoprinting frame 11 having a glass plate 13 therein. Located on top of frame 11, is an adjustment plate 15 having a motor 17 attached thereto. Opposite of adjustment plate 15, is an adjustment plate 16 with a screw mechanism 18 for drawing adjustment plates 15 and 16 proximate to one another through the action of motor 17. Photoprinting frame 11 attaches to adjusting plate 15 through a centering bolt 19 that fits within a centering bushing 20 to enable the two frames 11 and 12 to be brought into alignment when the frames 11 and 12 are disconnected from the adjustment plates 15 and 16. Located on the opposite side is a second centering bolt 22 that engages centering bolt 19 to support a copper-beryllium band hinge 21 that forms a hinge between adjustment plate 16 and photoprinting frame 12. FIG. 2 shows that a plurality of centering bolts 22 extending in a spaced relationship across frame 12 to hold band hinge 21. The glass photoprinting plates 13 and 14 are located on the inside of photoprinting frames 11 and 12 so that the glass photoprinting plates 13 and 14 can be brought into intimate contact with a resist covered web 30. Having the photoprinting plates 13 and 14 on the inside of the frames requires the replacement of the photoprinting plates 13 and 14 from the inside of the photoprinting frames, which means that to replace the photoprinting plates 13 and 14, one is required to vertically position the photoprinting glass plates within the frames, a task which becomes difficult or awkward with large photoprinting glass plates.

FIG. 2 shows a front view of the system with a copper beryllium band hinge 21 extending across the top portion of frame 12 and the bottom portion of adjustment plate 16 to form a hinge connection between frame 12 and adjustment plate 16. The use of the band hinge 21 is to ensure that when the oppositely disposed photoprinting frames 11 and 12 are swung open to move the resist covered web 30, the two photoprinting frames 11 and 12 with the respective photoprinting plates can be swung back into registration.

To understand the conventional operation of the photoprinting frames 11 and 12, reference should be made to FIG. 4 and FIG. 5 which in semi-schematic form shows two oppositely disposed photoprinting frames 11 and 12. FIG. 4 shows the photoprinting frames 11 and 12 in an oppositely disposed condition with a resist covered web 30 located therebetween. FIG. 5 shows the photoprinting frames 11 and 12 pivoted outward using the band hinge 21 as a pivot. When the two photoprinting frames 11 and 12 are swung apart as shown in FIG. 5, resist covered web 30 can be advanced to the next processing station.

To illustrate operation of the present invention, reference should be made to FIGS. 2–6.

FIG. 2 shows a first temporary hinging unit 40 positioned on one side of frame 12, and a second temporary hinging unit 42 located on the opposite side of frame 12. Hinging unit 40 includes an extendable and retractable pivot pin 41 and similarly a second hinged unit 42 located on the opposite side of frame 12 includes an extendible and retractable pivot pin 43. Pivot pins 41 and 43 can be extended or retracted through the use of electromagnets or the like.

Figure 3:
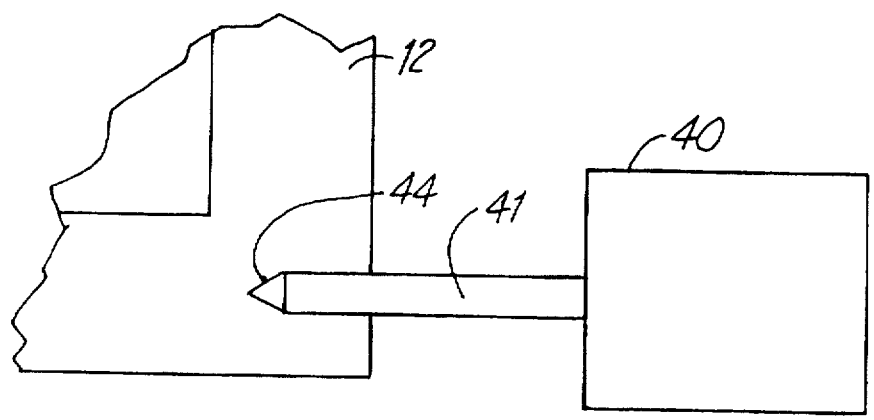
FIG. 3 shows an enlarged view of a portion of FIG. 2.

FIG. 3 shows detail of a portion of frame 12 with pivot pin 41 extended into a pivot bushing 44 in frame 12. Similarly, pivot pin 43 is extendable into a pivot pin bushing 46 on the opposite side of frame 12. The pivot bushings or pivot holes 44 and 46 are sufficiently large so that pivot pins 41 and 43 can be extended therein without binding. That is, the relationship between the pivot bushings 44 and 46 and the retractable pivot pins 41 and 43 is such that the photoprinting frames can be pivoted thereabout.

Figure 7:
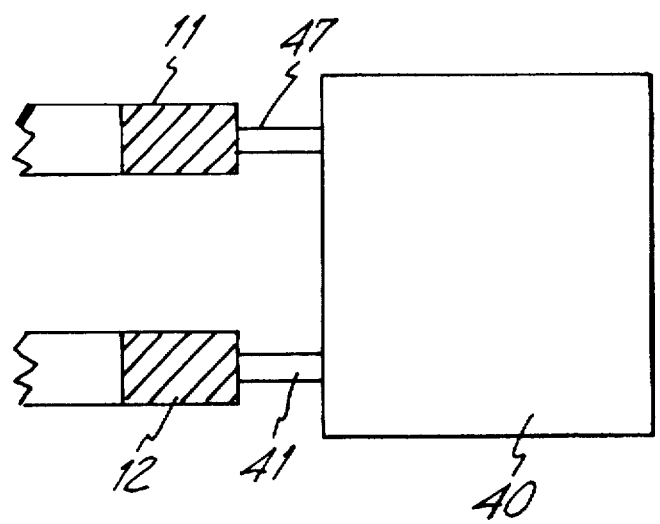
FIG. 7 shows a partial top view of the temporary hinging unit with extendable and retractable pivot pins in engagement with the photoprinting frames.

FIG. 7 illustrates a partial sectional view of frame 12 and frame 11 showing temporary hinging unit 40 including a second pivot pin 47 for temporarily engaging frame 11 to form a pivot support for the lower portion of frame 11. Similarly, temporary hinging unit 42 also includes a second pivot pin for temporarily engaging the opposite side of frame 11 to form a pivot support for the lower portion of frame 11.

In the normal operation of the system, the extendable and retractable pivot pins 41 and 43 of the temporary hinging units 40 and 42 are in the retracted position to allow for positioning of the photoprinting frames 11 and 12, and to permit movement of the resist covered web 30 therebetween. The present invention provides an on demand means for replacing the glass photoprinting plates 13 and 14 by forming a temporary pivotal engagement of the lower portions of frames 11 and 12. That is, the temporary hinging unit 40, which is shown in phantom in FIGS. 4, 5 and 6, and the counter part 42, extend their pivot pins 41 and 43 into engagement with the lower portion of frames 11 and 12 on only those photoprinting frames which need glass replacement. The pivot pins 41 and 43 are sufficiently strong so as to support the weight of the frames 11 and 12 while allowing pivoting of the frame about the pivot pins 41 and 43. When the pivot pins 41 and 43 are in pivotal engagement with the lower portions of frames 11 and 12, one can decouple band hinge 21 from adjusting plate 16 which allows the frame 12 to be swung downward toward the horizontal. In order to prevent the frame from falling downward, a cord or chain 50 extends around pulley 51 to a counter weight 52 which balances the weight of the photoprinting frame. Thus, little effort is required to either lower or raise the photoprinting frames 11 and 12.

FIG. 6 shows band hinge 21 decoupled with chain 50 holding frame 12 in a horizontal position. In this condition, one can quickly and easily replace the glass by lifting the old glass from frame 12 and laying the new glass in place. Similarly, frame 11 can be decoupled from adjustment plate 15 and be connected to chain 50 so that frame 11 can be lowered to the horizontal position for replacement of the glass. Thus, by use of an extendable and retractable pivot pin that is extendable to engagement with pivot holes in the photoprinting frame, the photoprinting frame can pivot about the bottom of the frame to permit the photoprinting frame to be rotated toward a horizontal position to facilitate removal and replacement of a glass photoprinting plate when band hinge is disconnected. While only frame 12 is shown in the swung away position, frame 11 can also be swung out in a similar manner to facilitate replacement of the photoprinting glass therein.

When the glass plate has been replaced, the photoprinting frames 11 and 12 are swung to the vertical position and the centering pins 19 and 22 are brought into engagement to realign the two frames 11 and 12 with each other for further processing of the metal webs therein. The pivot pins are retracted to permit conventional operation and alignment of the two photoprinting frames and there respective photoprinting plates.

We claim:

1. A photoprinting assembly to facilitate replacement of a photoprinting glass plate therein comprising:

a first member;

a first photoprinting frame, said frame having a top and a bottom with said top of said frame secured to said first member;

a second member;

a second photoprinting frame, said frame having a top and a bottom;

a hinge secured to said second member and said top of said second photoprinting frame to permit the bottom of said second photoprinting frame to be swung away to permit advancement of an article therebetween;

a pivot hole located in the bottom of said second photoprinting frame;

an extendable and retractable pivot pin, said extendable and retractable pin extendable to engagement with said pivot hole to allow said second photoprinting frame to pivot about said bottom of said second glass photoprinting frame to permit said bottom of said second photoprinting frame to be rotated toward a horizontal position to facilitate removal and replacement of a glass photoprinting plate when said hinge is disconnected in said second photoprinting frame.

2. The photoprinting assembly of claim 1 including a set of centering pins for holding said hinge to said first member, with said centering pins removable to allow said hinge to swing free of said first member.

3. The photoprinting assembly of claim 1 including a counter weight for supporting said second photoprinting frame when said second photoprinting frame is pivoted about said pivot hole.

4. The photoprinting assembly of claim 2 including an electromagnet for extending and retracting said pivot pin.

5. The photoprinting assembly of claim 4 wherein each of the photoprinting plates includes pivot holes for pivoting the photoprinting frame thereabout.

6. The photoprinting assembly of claim 5 wherein the photoprinting frames includes a glass photoprinting plate.

7. The photoprinting assembly of claim 6 wherein the hinge comprises a band hinge.

8. The photoprinting assembly of claim 7 wherein said members comprise adjustment plates.

9. The photoprinting assembly of claim 8 wherein each of the photoprinting frames includes a set of oppositely disposed pivot holes.

10. A method of replacing a photoprinting plate in a photoprinting frame, wherein the photoprinting frames are hingedly supported at the top of the photoprinting frames comprising the steps of:

temporarily extending a retractable pivot pin into the lower portion of the photoprinting frame;

decoupling the hinged support at the top of the photoprinting frames;

allowing the photoprinting plate to pivot toward a horizontal position about the retractable pivot pin extending into the photoprinting frame;

replacing a photoprinting glass plate while the photoprinting frame is pivoted about the lower portion of the photoprinting frame;

pivoting the photoprinting frame to an upright position to engage the top hinge of the photoprinting plate; and retracting the retractable pins to allow the photoprinting frame to be pivoted about the top hinge of the photoprinting plate.

* * * * *